(12) United States Patent
Nishida (10) Patent No.: US 11,965,240 B2
(45) Date of Patent: Apr. 23, 2024

(54) CLEANING METHOD, METHOD OF MANUFACTURING SEMICONDUCTOR DEVICE, AND SUBSTRATE PROCESSING APPARATUS

(71) Applicant: KOKUSAI ELECTRIC CORPORATION, Tokyo (JP)

(72) Inventor: Keigo Nishida, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 508 days.

(21) Appl. No.: 17/191,420

(22) Filed: Mar. 3, 2021

(65) Prior Publication Data
US 2021/0277518 A1 Sep. 9, 2021

(30) Foreign Application Priority Data

Mar. 4, 2020 (JP) .................................. 2020-036609

(51) Int. Cl.
*C23C 16/44* (2006.01)
*C23C 16/34* (2006.01)
(Continued)

(52) U.S. Cl.
CPC ........ *C23C 16/4405* (2013.01); *C23C 16/345* (2013.01); *C23C 16/40* (2013.01);
(Continued)

(58) Field of Classification Search
CPC ... C23C 16/345; C23C 16/40; C23C 16/4405; C23C 16/52; H01L 21/0217;
(Continued)

(56) References Cited

U.S. PATENT DOCUMENTS

2004/0002220 A1 1/2004 Mizushima
2005/0279381 A1 12/2005 Masuda et al.
(Continued)

FOREIGN PATENT DOCUMENTS

CN 1711628 A 12/2005
JP 2004-260204 A 9/2004
(Continued)

OTHER PUBLICATIONS

Taiwan Office Action dated Jan. 13, 2022 for Taiwan Patent Application No. 110103390.
(Continued)

*Primary Examiner* — Brook Kebede
(74) *Attorney, Agent, or Firm* — Volpe Koenig (57) ABSTRACT

There is provided a technique that includes: removing a deposit that adheres to an interior of a process chamber by performing a cycle a predetermined number of times, the cycle including performing sequentially: (a) supplying a cleaning gas to the interior of the process chamber until an internal pressure of the process chamber rises to a first pressure range; (b) exhausting the interior of the process chamber and supplying the cleaning gas to the interior of the process chamber in parallel to maintain the internal pressure of the process chamber within the first pressure range; and (c) exhausting the interior of the process chamber until the internal pressure of the process chamber reaches a second pressure that is below the first pressure range.

15 Claims, 7 Drawing Sheets

(51) Int. Cl.
  *C23C 16/40* (2006.01)
  *C23C 16/52* (2006.01)
  *H01L 21/02* (2006.01)
  *H01L 21/67* (2006.01)

(52) U.S. Cl.
  CPC .......... *C23C 16/52* (2013.01); *H01L 21/0217* (2013.01); *H01L 21/02263* (2013.01); *H01L 21/67017* (2013.01); *H01L 21/67253* (2013.01)

(58) Field of Classification Search
  CPC ......... H01L 21/02263; H01L 21/67017; H01L 21/67253; H01J 37/32009; H01J 37/3244; H01J 37/32862
  See application file for complete search history.

(56) References Cited

U.S. PATENT DOCUMENTS

| | | |
|---|---|---|
| 2006/0068598 A1 | 3/2006 | Okada et al. |
| 2015/0000695 A1 | 1/2015 | Noda et al. |
| 2015/0031216 A1 | 1/2015 | Akae et al. |
| 2015/0376781 A1 | 12/2015 | Kogura et al. |
| 2017/0087606 A1 | 3/2017 | Nakamura et al. |
| 2017/0260626 A1 | 9/2017 | Nagato et al. |
| 2019/0127848 A1 | 5/2019 | Nagato et al. |
| 2020/0115795 A1* | 4/2020 | Manna .............. H01J 37/32449 |
| 2020/0407845 A1* | 12/2020 | Miyashita ................ B08B 9/00 |

FOREIGN PATENT DOCUMENTS

| | | |
|---|---|---|
| JP | 2005-317920 A | 11/2005 |
| JP | 2015-012198 A | 1/2015 |
| JP | 2015-026660 A | 2/2015 |
| JP | 2016-012701 A | 1/2016 |
| JP | 2017-069230 A | 4/2017 |
| JP | 2017-168496 A | 9/2017 |
| TW | I269378 B | 12/2006 |
| WO | 2017/212728 A1 | 12/2017 |
| WO | 2019/163295 A1 | 8/2019 |

OTHER PUBLICATIONS

Japanese Office Action dated Feb. 1, 2022 for Japanese Patent Application No. 2020-036609.

* cited by examiner

CLEANING METHOD, METHOD OF MANUFACTURING SEMICONDUCTOR DEVICE, AND SUBSTRATE PROCESSING APPARATUS

CROSS-REFERENCE TO RELATED APPLICATION(S)

This application is based upon and claims the benefit of priority from Japanese Patent Application No. 2020-036609, filed on Mar. 4, 2020, the entire contents of which are incorporated herein by reference.

TECHNICAL FIELD

The present disclosure relates to a cleaning method, a method of manufacturing a semiconductor device, and a substrate processing apparatus.

BACKGROUND

As a process of manufacturing a semiconductor device, a cleaning process of supplying a cleaning gas into a process chamber in which substrates are processed, so as to remove deposits and the like adhered to the interior of the process chamber is often performed.

SUMMARY

The interior of the process chamber may not be efficiently cleaned depending on an internal pressure of the process chamber when the cleaning gas is supplied.

Some embodiments of the present disclosure provide a technique capable of improving the cleaning efficiency of the interior of a process chamber.

According to one or more embodiments of the present disclosure, there is provided a technique that includes: removing a deposit that adheres to an interior of a process chamber by performing a cycle a predetermined number of times, the cycle including performing sequentially: (a) supplying a cleaning gas to the interior of the process chamber until an internal pressure of the process chamber rises to a first pressure range, in a state where exhaust of the interior of the process chamber is stopped; (b) exhausting the interior of the process chamber and supplying the cleaning gas to the interior of the process chamber in parallel to maintain the internal pressure of the process chamber within the first pressure range; and (c) exhausting the interior of the process chamber until the internal pressure of the process chamber reaches a second pressure that is below the first pressure range, in a state where supply of the cleaning gas to the interior of the process chamber is stopped.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments

One or more embodiments of the present disclosure will be now described with reference to FIGS. 1 to 3.

(1) Configuration of Substrate Processing Apparatus

Figure 1:
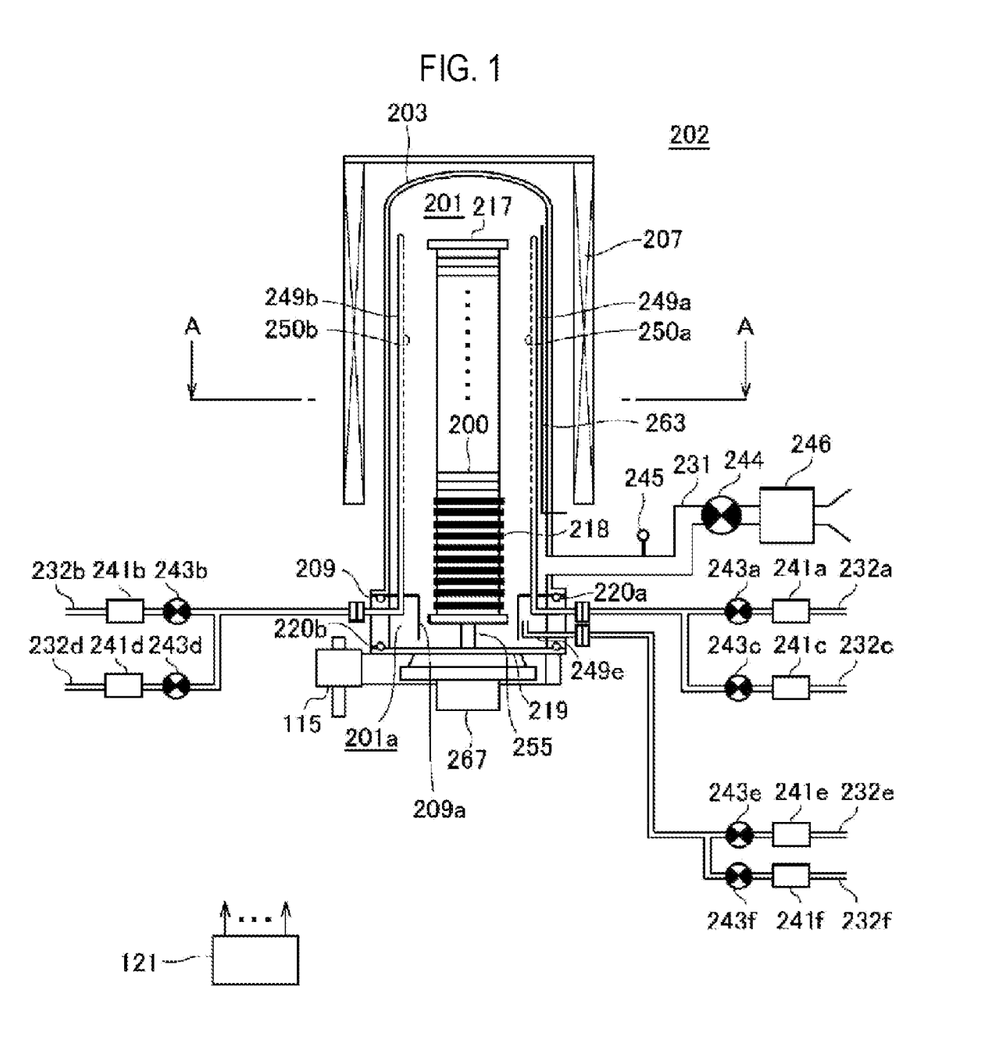
FIG. 1 is a schematic configuration view of a vertical process furnace of a substrate processing apparatus suitably used in embodiments of the present disclosure, in which a portion of the process furnace is shown in a vertical cross section.

As shown in FIG. 1, a process furnace 202 includes a heater 207 as a heating means (a heating mechanism). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC) and has a cylindrical shape with its upper end closed and its lower end opened. A manifold 209 is disposed to be concentric with the reaction tube 203 under the reaction tube 203. The manifold 209 is made of, for example, metal such as stainless steel (SUS: Steel Use Stainless) and has a cylindrical shape with both of its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 also includes an inner wall of the process container. The process chamber 201 is configured to accommodate a plurality of wafers 200 as substrates. A cover 209a is installed at the inner circumference of the manifold 209. The cover 209a is made of, for example, quartz or SiC and is installed so as to cover an inner wall of the manifold 209 along the inner wall of the manifold 209.

Nozzles 249a, 249b, and 249e are installed in the process chamber 201 so as to penetrate the manifold 209. The nozzles 249a, 249b, and 249e are made of, for example, a heat resistant material such as quartz or SiC. Gas supply pipes 232a, 232b, and 232e are connected to the nozzles 249a, 249b, and 249e, respectively.

Mass flow controllers (MFCs) 241a, 241b, and 241e, which are flow rate controllers (flow rate control parts), and valves 243a, 243b, and 243e, which are opening/closing valves, are installed in the gas supply pipes 232a, 232b, and 232e, respectively, sequentially from the upstream side. Gas supply pipes 232c, 232d, and 232f supplying an inert gas are connected to the gas supply pipe 232a, 232b, and 232e at the downstream side of the valves 243a, 243b, and 243e, respectively. MFCs 241c, 241d, and 241f and valves 243c, 243d, and 243f are installed in the gas supply pipes 232c, 232d, and 232f, respectively, sequentially from the upstream side.

Figure 2:
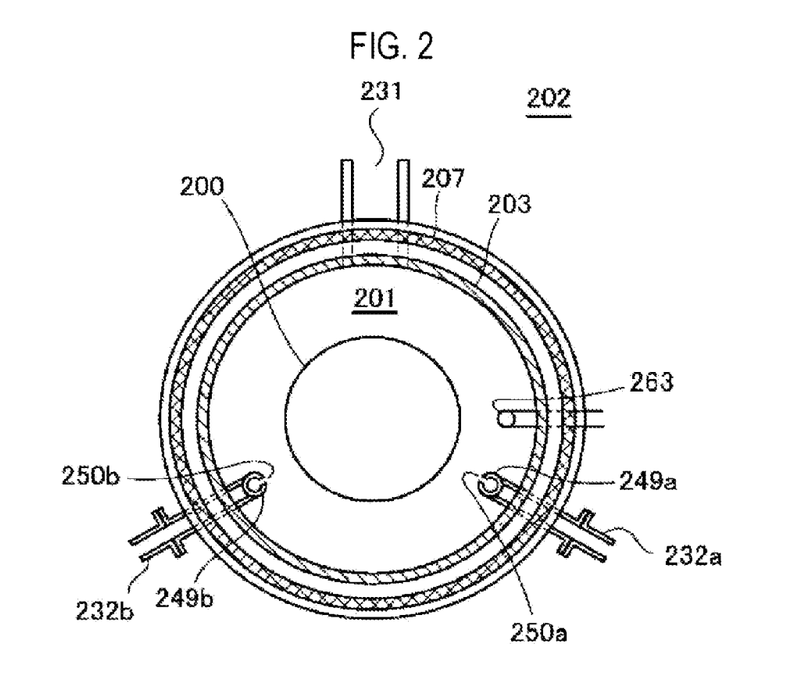
FIG. 2 is a schematic configuration view of the vertical process furnace of the substrate processing apparatus suitably used in the embodiments of the present disclosure, in which a portion of the process furnace is shown in a cross section taken along line A-A in FIG. 1.

As shown in FIG. 2, each of the nozzles 249a and 249b is disposed in an annular space between the inner wall of the reaction tube 203 and the wafers 200 so as to extend upward along an arrangement direction of the wafers 200 from a lower portion of the inner wall of the reaction tube 203 to an upper portion thereof. Specifically, each of the nozzles 249a and 249b is installed at a lateral side of a wafer arrangement region in which the wafers 200 are arranged, in a region horizontally surrounding the wafer arrangement region, along the wafer arrangement region. Gas supply holes 250a and 250b supplying a gas are formed on side surfaces of the nozzles 249a and 249b, respectively. The gas supply holes 250a and 250b are opened toward the center of the reaction tube 203 to allow the gas to be supplied toward the wafers 200. A plurality of gas supply holes 250a and 250b may be formed from a lower portion of the reaction tube 203 to an upper portion thereof.

As shown in FIG. 1, the nozzle 249e is configured to eject a gas into an annular space (hereinafter also referred to as a purge space) 201a between the inner wall of the manifold 209 and the cover 209a. A gas supply hole is formed at the leading end portion of the nozzle 249e so as to be opened upward. The gas supply hole may be formed on the side surface of the leading end portion of the nozzle 249e, in which case the gas supply hole is opened toward the horizontal direction.

A processing gas (precursor gas), for example, a gas containing Si as a predetermined element (main element), and a halogen element, that is, a halosilane precursor gas, is supplied from the gas supply pipe 232a into the process chamber 201 via the MFC 241a, the valve 243a, and the nozzle 249a.

The precursor gas refers to a gaseous precursor, for example, a gas obtained by vaporizing a precursor which remains in a liquid state at room temperature and atmospheric pressure, or a precursor which remains in a gas state at room temperature and atmospheric pressure. The halosilane precursor refers to a precursor including a halogen group. The halogen group includes a chloro group, a fluoro group, a bromo group, an iodo group, and the like. That is, the halogen group contains a halogen element such as chlorine (Cl), fluorine (F), bromine (Br), iodine (I), or the like.

An example of the precursor gas may include a halosilane precursor gas containing Si and Cl, that is, a chlorosilane precursor gas. An example of the chlorosilane precursor gas may include a hexachlorodisilane ($Si_2Cl_6$, abbreviation: HCDS) gas.

A processing gas (reaction gas), for example, an oxygen (O)-containing gas, is supplied from the gas supply pipe 232b into the process chamber 201 via the MFC 241b, the valve 243b, and the nozzle 249b. The O-containing gas acts as an oxidizing gas, that is, an O source, in a film-forming process which will be described later. An example of the oxidizing gas may include an oxygen ($O_2$) gas.

A processing gas (reaction gas), for example, a hydrogen (H)-containing gas, is supplied from the gas supply pipe 232a into the process chamber 201 via the MFC 241a, the valve 243a, and the nozzle 249a. The H-containing gas cannot obtain an oxidizing action by itself, but in the film-forming process to be described later, it reacts with an O-containing gas under a specific condition to produce oxidizing species such as atomic oxygen (O) and the like, which acts to improve the efficiency of an oxidizing process. Therefore, the H-containing gas may be included in the oxidizing gas, like the O-containing gas. An example of the H-containing gas may include a hydrogen (112) gas.

Further, a cleaning gas, for example, a H- and F-containing gas (H-containing fluorine-based gas), is supplied from the gas supply pipes 232a and 232b into the process chamber 201 via the MFCs 241a and 241b, the valves 243a and 243b, and the nozzles 249a and 249b, respectively. A cleaning gas, for example, a H- and F-containing gas, is supplied from the gas supply pipe 232e into the purge space 201a inside the cover 209a via the MFC 241e, the valve 243e, and the nozzle 249e. An example of the H- and F-containing gas may include a hydrogen fluoride (HF) gas.

An inert gas, for example, a nitrogen ($N_2$) gas, is supplied from the gas supply pipes 232c, 232d, and 232f into the process chamber 201 via the MFC 241c, 241d, and 241f, the valves 243c, 243d, and 243f, the gas supply pipes 232a, 232b, and 232e, and the nozzles 249a, 249b, and 249e, respectively.

A precursor gas supply system for supplying a precursor gas mainly includes the gas supply pipe 232a, the MFC 241a, and the valve 243a. An oxidizing gas supply system mainly includes the gas supply pipe 232b, the MFC 241b, and the valve 243b. A H-containing gas supply system mainly includes the gas supply pipe 232a, the MFC 241a, and the valve 243a. The H-containing gas supply system may include the above-mentioned oxidizing gas supply system. A H- and F-containing gas supply system mainly includes the gas supply pipes 232a, 232b, and 232e, the MFCs 241a, 241b, and 241e, and the valves 243a, 243b, and 243e. An inert gas supply system mainly includes the gas supply pipes 232c, 232d, and 232f, the MFCs 241c, 241d, and 241f, and the valves, 243c, 243d, and 243f.

One or all of the above-described various supply systems may be configured as an integrated-type gas supply system 248 in which the valves 243a to 243f, the MFCs 241a to 241f, and so on are integrated. The integrated-type gas supply system 248 is connected to each of the gas supply pipes 232a to 232f. In addition, the integrated-type gas supply system 248 may be configured such that operations of supplying various gases into the gas supply pipes 232a to 232f (that is, opening/closing operation. of the valves 243a to 243f, flow rate adjustment operation by the MFCs 241a to 241*f*, and the like) are controlled by a controller 121 which will be described later. The integrated-type gas supply system 248 is configured as an integral type or detachable-type integrated. unit and may be attached to and detached from the gas supply pipes 232*a* to 232*f* and the like on an integrated unit basis, so that the maintenance, replacement, extension, etc. of the gas supply system can be performed on an integrated unit basis.

An exhaust pipe 231 for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting part) for detecting the internal pressure of the process chamber 201, and an APC (Auto Pressure Controller) valve 244, which is a pressure regulator (pressure adjustment part). The APC valve 244 is configured to perform or stop a vacuum-exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace-opening cover configured to hermetically seal a lower end opening of the manifold 209, is installed under the manifold 209. The seal cap 219 is made of, for example, metal such as SUS and is formed in a disc shape. An O-ring 220*b*, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically moved up and down by a boat elevator 115, which is an elevating mechanism installed outside the reaction tube 203. The boat elevator 115 is configured to be able to load/unload the boat 217 in/out of the process chamber 201 by moving the seal cap 219 up and down. The boat elevator 115 is configured as a transfer device (transfer mechanism) which transfers the boat 217, that is, the wafers 200, into/out of the process chamber 201.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, a heat resistant material such as quartz or SiC. Heat-insulating plates 218 made of, for example, a heat resistant material such as quartz or SiC, are installed below the boat 217 in a horizontal posture and in multiple stages. With this configuration, heat from the heater 207 is less likely to be transferred to the seal cap 219 side. Instead of installing the heat-insulating plates 218, a heat-insulating tube configured as a tubular member made of a heat resistant material such as quartz or SiC may be installed.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
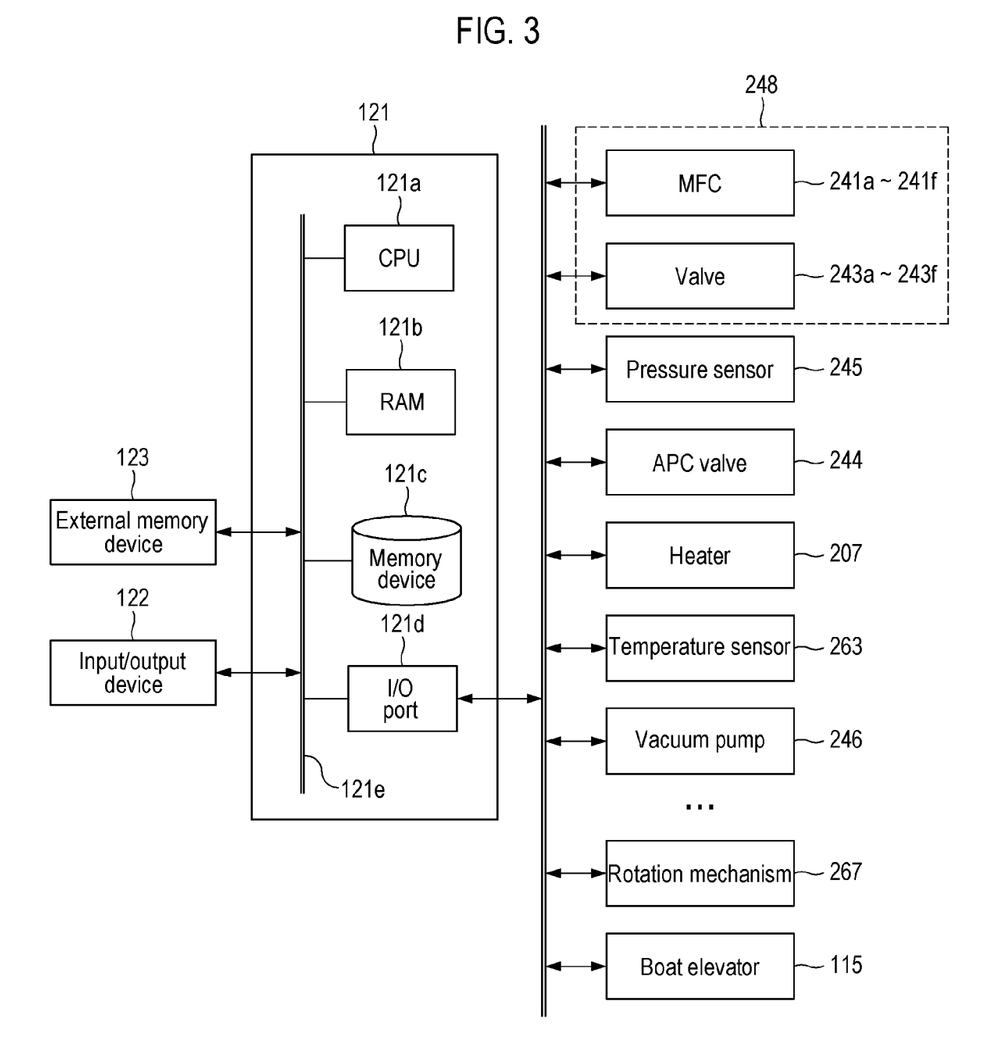
FIG. 3 is a schematic configuration diagram of a controller of the substrate processing apparatus suitably used in the embodiments of the present disclosure, in which a control system of the controller is shown in a block diagram.

As shown in FIG. 3, a controller 121, which is a control part (control means), may be configured as a computer including a CPU (Central Processing Unit) 121*a*, a RAM (Random Access Memory) 121*b*, a memory 121*c*, and an I/O port 121*d*. The RAM 121*b*, the memory 121*c*, and the I/O port 121*d* are configured to exchange data with the CPU 121*a* via an internal bus 121*e*. An input/output device 122 formed of, e.g., a touch panel or the like, is connected to the controller 121.

The memory 121*c* is configured by, for example, a flash memory, a HDD (Hard Disk Drive), or the like. A control program for controlling operations of a substrate processing apparatus, a process recipe in which sequences and conditions of substrate processing to be described later are written, and a cleaning recipe in which sequences and conditions of a cleaning process to be described later are written, are readably stored in the memory 121*c*. The process recipe functions as a program for causing the controller 121 to execute each sequence in the film-forming processing, which will be described later, to obtain an expected result. The cleaning recipe functions as a program for causing the controller 121 to execute each sequence in the cleaning process, which will be described later, to obtain an expected result. Hereinafter, the process recipe, the cleaning recipe, and the control program may be generally and simply referred to as a "program." Furthermore, the process recipe and the cleaning recipe may be simply referred to as a "recipe." When the term "program" is used herein, it may indicate a case of including the recipe only, a case of including the control program only, or a case of including any combination of the process recipe, the cleaning recipe, and the control program. The RAM 121*b* is configured as a memory area (work area) in which a program or data read by the CPU 121*a* is temporarily stored.

The I/O port 121*d* is connected to the MFCs 241*a* to 241*f*, the valves 243*a* to 243*f*, the pressure sensor 245, the APC valve 244, the vacuum pump 246, the heater 207, the temperature sensor 263, the rotation mechanism 267, the boat elevator 115, and so on.

The CPU 121*a* is configured to read and execute the control program from the memory 121*c*. The CPU 121*a* is also configured to read the recipe from the memory 121*c* according to an input of an operation command from the input/output device 122. In addition, the CPU 121*a* is configured to control the flow-rate-adjusting operation of various kinds of gases by the MFCs 241*a* to 241*f*, the opening/closing operation of the valves 243*a* to 243*f*, the opening/closing operation of the APC valve 244, the pressure-adjusting operation performed by the APC valve 244 based on the pressure sensor 245, the actuating and stopping of the vacuum pump 246, the temperature-adjusting operation performed by the heater 207 based on the temperature sensor 263, the operation of adjusting the rotation and the rotation speed of the boat 217 by the rotation mechanism 267, the operation of moving the boat 217 up and down by the boat elevator 115, and so on, according to contents of the read recipe.

The controller 121 may be configured by installing, on the computer, the aforementioned program stored in an external memory (for example, a magnetic disk such as a hard disk, an optical disc such as a CD or DVD, a magneto-optical disc such as a MO, or a semiconductor memory such as a USB memory) 123. The memory 121c and the external memory 123 is configured as a non-transitory computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. Furthermore, the program may be provided to the computer by using communication means such as the Internet or a dedicated line, instead of using the external memory 123.

(2) Film-Forming Process

Figure 4:
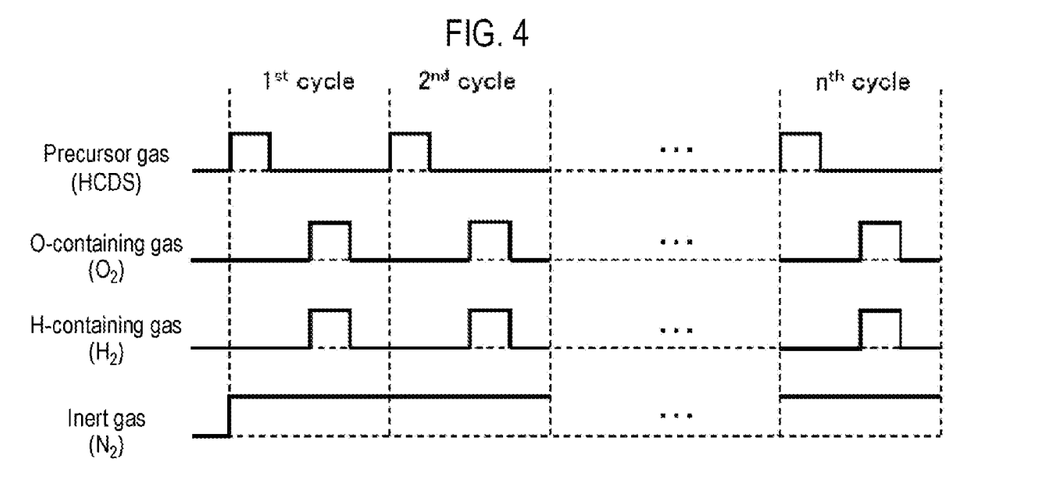
FIG. 4 is a diagram showing the timing of gas supply in a film-forming process according to the embodiments of the present disclosure.

As a process of manufacturing a semiconductor device, a sequence example of forming a film on a substrate by using the above-described substrate processing apparatus will be described with reference to FIG. 4. In the following descriptions, the operations of various parts constituting the substrate processing apparatus are controlled by the controller 121.

In the film-forming sequence shown in FIG. 4, a silicon oxide film ($SiO_2$ film, hereinafter simply referred to as a SiO film), which is an O-containing film, is formed on a wafer 200 by performing a cycle a predetermined number of times (n times or more), the cycle including non-simultaneously, that is, without synchronization, performing: a step 1 of supplying a HCDS gas as a precursor gas to the wafer 200 accommodated in a process container (process chamber 201), and a step 2 of supplying an $O_2$ gas as an O-containing gas and a $H_2$ gas as a H-containing gas into the process container under a heated pressure below the atmospheric pressure.

In the present disclosure, for the sake of convenience, the film-forming sequence may be denoted as follows. The same denotation may be used in other embodiments to be described later.

(HCDS→$O_2$+$H_2$)×n⇒SiO

When the term "substrate" is used in the present disclosure, it may be synonymous with the term "wafer."

(Wafer Charging and Boat Loading)

When a plurality of wafers 200 are charged on the boat 217 (wafer charging), as shown in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220b.

(Pressure/Temperature-Adjusting Step)

The interior of the process chamber 201, namely, a space in which the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. The vacuum pump 246 is always kept in operation until at least the process to the wafers 200 is completed. The wafers 200 in the process chamber 201 are heated by the heater 207 to a desired temperature. At this time, the degree of supplying electric power to the heater 207 is feedback-controlled based on the temperature information detected by the temperature sensor 263 such that the interior of the process chamber 201 has a desired temperature distribution. The heating of the interior of the process chamber 201 by the heater 207 is continuously performed at least until the process to the wafers 200 is completed. The rotation of the boat 217 and the wafers 200 by the rotation mechanism 267 is then initiated. The rotation of the boat 217 and the wafers 200 by the rotation mechanism 267 is continuously performed at least until the process to the wafers 200 is completed.

(Film-Forming Step)

Subsequently, the following steps 1 and 2 are performed sequentially.

[Step 1]

In this step, a HCDS gas is supplied to the wafer 200 in the process chamber 201.

The valve 243a is opened to allow the HCDS gas to flow into the gas supply pipe 232a. The flow rate of the HCDS gas is adjusted by the MFC 241a, and the HCDS gas is supplied into the process chamber 201 via the nozzle 249a and is exhausted through the exhaust pipe 231. In this operation, the HCDS gas is supplied to the wafer 200. At the same time, the valve 243c is opened to allow a $N_2$ gas to flow into the gas supply pipe 232c. The flow rate of the $N_2$ gas is adjusted by the MFC 241c, and the $N_2$ gas is supplied into the process chamber 201 via the gas supply pipe 232a and the nozzle 249a and is exhausted through the exhaust pipe 231. Further, in order to prevent the HCDS gas from penetrating into the nozzles 249b and 249e, the valves 243d and 243f are opened to allow a $N_2$ gas to flow into the gas supply pipes 232d and 232f. The $N_2$ gas is supplied into the process chamber 201 via the gas supply pipes 232b and 232e, the nozzles 249b and 249e, and the purge space 201a and is exhausted through the exhaust pipe 231.

At this time, the internal pressure of the process chamber 201 is set to a pressure within a range of, for example, 0.0075 to 30 Torr (1 to 4,000 Pa), specifically 0.5025 to 19.995 Torr (67 to 2,666 Pa), more specifically 0.9975 to 9.9975 Torr (1.33 to 1,333 Pa). The supply flow rate of the HCDS gas is set to a flow rate within a range of, for example, 0.001 to 2 slm (1 to 2,000 sccm), specifically 0.01 to 1 slm (10 to 1,000 sccm.). The supply flow rate of the $N_2$ gas supplied from each gas supply pipe is set to a flow rate within a range of, for example, 0.1 to 1.0 slm (100 to 10,000 sccm). The supply time of the HCDS gas is set to a time within a range of, for example, 1 to 120 seconds, specifically 1 to 60 seconds. The temperature of the heater 207 is set so that the temperature of the wafer 200 is, for example, 250 to 700 degrees C., specifically 300 to 650 degrees C., more specifically 350 to 600 degrees C.

By supplying the HCDS gas to the wafer 200 under the aforementioned conditions, a Si-containing layer containing Cl having a thickness of, for example, less than one atomic layer to several atomic layers (less than one molecular layer to several molecular layers) is formed as a first layer (initial layer) on the outermost surface of the wafer 200. The Si-containing layer containing Cl may be a Si layer containing Cl, an adsorption layer of HCDS, or both of them.

After the first layer is formed, the valve 243a is closed to stop the supply of the HCDS gas. At this time, with the APC valve 244 kept open, the interior of the process chamber 201 is vacuum-exhausted by the vacuum pump 246 to remove the unreacted HCDS gas remaining in the process chamber 201 or the HCDS gas after contributing to the formation of the first layer from the process chamber 201. At this time, with the valves, 243c, 243d, and 243f kept open, the supply of the $N_2$ gas into the process chamber 201 is maintained. The $N_2$ gas acts as a purge gas.

As the precursor gas, in addition to the HCDS gas, it may be possible to use, e.g., inorganic precursor gases such as a dichlorosilane ($SiH_2Cl_2$, abbreviation: DCS) gas, a monochlorosilane ($SiH_3Cl$, abbreviation: MCS) gas, a tetrachlorosilane ($SiCl_4$, abbreviation: STC) gas, a trichlorosilane (SiHCl$_3$, abbreviation: TCS) gas, a trisilane (Si$_3$Cl$_8$, abbreviation: TS) gas, a disilane (Si$_2$Cl$_6$, abbreviation: DS) gas, and a monosilane (SiH$_4$, abbreviation: MS) gas, and organic precursor gases such as a tetrakisdimethylaminosilane (Si[N(CH$_3$)$_2$]$_4$, abbreviation: 4DMAS) gas, a trisdimethylaminosilane (Si[N(CH$_3$)$_2$]$_3$H, abbreviation: 3DMAS) gas, a bisdiethylaminosilane (Si[N(C$_2$H$_5$)$_2$]$_2$H$_2$, abbreviation: BDEAS) gas, a bistert-butylaminosilane (SiH$_2$[NH(C$_4$H$_9$)]$_2$, abbreviation: BTBAS) gas, and a diisopropylaminosilane (SiH$_3$N[CH(CH$_3$)$_2$]$_2$, abbreviation: DIPAS) gas.

As the inert gas, in addition to the N$_2$ gas, it may be possible to use, e.g., rare gases such as an Ar gas, a He gas, a Ne gas, and a Xe gas.

[Step 2]

After the step 1 is completed, an O$_2$ gas and a H$_2$ gas are separately supplied into the process chamber 201 and are mixed to react with each other in the process chamber 201.

In this step, the opening/closing control of the valves 243b to 243d and 243f is performed in the same procedure as the opening/closing control of the valves 243a, 243c, 243d, and 243f in the step 1. The flow rate of the O$_2$ gas is adjusted by the MFC 241b, and the O$_2$ gas is supplied into the process chamber 201 via the nozzle 249b. At the same time, the valve 243a is opened to allow the H$_2$ gas to flow into the gas supply pipe 232a. The flow rate of the H$_2$ gas is adjusted by the MFC 241a, and the H$_2$ gas is supplied into the process chamber 201 via the nozzle 249a. The O$_2$ gas and the H$_2$ gas are mixed to react with each other for the first time in the process chamber 201 and then are exhausted through the exhaust pipe 231.

At this time, the internal pressure of the process chamber 201 is set to a pressure below the atmospheric pressure, within a range of, for example, 0.0075 to 9.9975 Torr (1 to 1,333 Pa). The supply flow rate of the O$_2$ gas is set to a flow rate within a range of, for example, 1 to 10 slm (1,000 to 10,000 sccm). The supply flow rate of the H$_2$ gas is set to a flow rate within a range of, for example, 1 to 10 slm (1,000 to 10,000 sccm). The supply time of the O$_2$ gas and H$_2$ gas is set to a time in the range of, for example, 1 to 120 seconds. Other process conditions are, for example, the same process conditions as in the step 1.

By supplying the O$_2$ gas and the H$_2$ gas into the process chamber 201 under the above-mentioned conditions, the O$_2$ gas and the H$_2$ gas are thermally activated (excited) to react with each other by non-plasma under a heated reduced pressure atmosphere, whereby water (H$_2$O)-free oxidizing species including oxygen such as atomic oxygen (O) is produced. Then, mainly by this oxidizing species, the first layer formed on the wafer 200 in the step 1 is subjected to an oxidizing process. Since the energy of this oxidizing species is higher than the bonding energy of Si—Cl, Si—H, etc. included in the first layer, giving the energy of this oxidizing species to the first layer separates the Si—Cl bond, the Si—H bond, etc. included in the first layer. H, Cl, etc. from which the bond with Si is separated are removed from the film and are discharged as Cl$_2$, HCl, etc. In addition, the bonding hand of Si left after the separation from the bond with H, Cl, etc. is connected to O contained in the oxidizing species to form a Si—O bond. In this way, the first layer is changed (modified) into a second layer, that is, a SiO layer having a low content of impurities such as Cl.

(Residual Gas Removal)

After the first layer is changed into the second layer (SiO layer), the valves 243b and 243a are closed to stop the supply of the O$_2$ gas and the H$_2$ gas. Then, according to the same processing procedure and process conditions as in the step 1, the O$_2$ gas, the H$_2$ gas, and reaction by-products remaining in the process chamber 201 are removed from the process chamber 201.

In addition to the O$_2$ gas, an ozone (O$_3$) gas or the like can be used as the O-containing gas. In addition to the H$_2$ gas, a deuterium (D$_2$) gas or the like can be used as the H-containing gas. In a case where an aminosilane precursor gas such as a 4DMAS gas or a 3DMAS gas is used as the precursor gas, when an O$_3$ gas is used as the O-containing gas, it is also possible to form a film at a sufficient (similar) deposition rate without using the H-containing gas. In addition to the N$_2$ gas, for example, various rare gases exemplified in the step 1 can be used as the inert gas.

[Performing Predetermined Number of Times]

By performing a cycle a predetermined number of times (n times), the cycle including non-simultaneously, that is, without synchronization, performing the above-described steps 1 and 2, a SiO film having a predetermined film thickness can be formed on the wafer 200. The above cycle may be repeated a plurality of times. That is, the thickness of the second layer formed per cycle is made smaller than a predetermined film thickness, and the above cycle may be repeated a plurality of times until the film thickness of a film formed by laminating second layers reaches the predetermined film thickness.

(After-Purging Step and Atmospheric-Pressure-Returning Step)

When the film-forming step is completed and the SiO film having a predetermined film thickness is formed, a N$_2$ gas is supplied into the process chamber 201 from each of the gas supply pipes 232c, 232d, and 232f and exhausted through the exhaust pipe 231. The N$_2$ gas acts as a purge gas. As a result, the interior of the process chamber 201 is purged to remove a gas and reaction by-products remaining in the process chamber 201 from the interior of the process chamber 201 (after-purging). After that, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

After that, the seal cap 219 is moved down by the boat elevator 115 to open the lower end of the manifold 209, and the processed wafers 200 are unloaded from the lower end of the manifold 209 to the outside of the reaction tube 203 while being supported by the boat 217 (boat unloading). After being unloaded to the outside of the reaction tube 203, the processed wafers 200 are discharged from the boat 217 (wafer discharging).

(3) Cleaning Process

When the above-described film-forming process is performed, deposits including a thin film such as a Si-containing SiO film and reaction by-products accumulate on the surfaces of the members in the process chamber 201, for example, the inner wall of the reaction tube 203, the inner walls and surfaces of the nozzles 249a and 249b, the surface of the cover 209a, the surface of the boat 217, the inner wall of the manifold 209, etc. That is, these deposits adhere to and accumulate on the surfaces of the members in the heated process chamber 201. Therefore, a cleaning process is performed at the point of time when the amount of deposits, that is, the cumulative film thickness, reaches a predetermined amount (thickness) before the deposits are peeled off or dropped.

Figure 5:
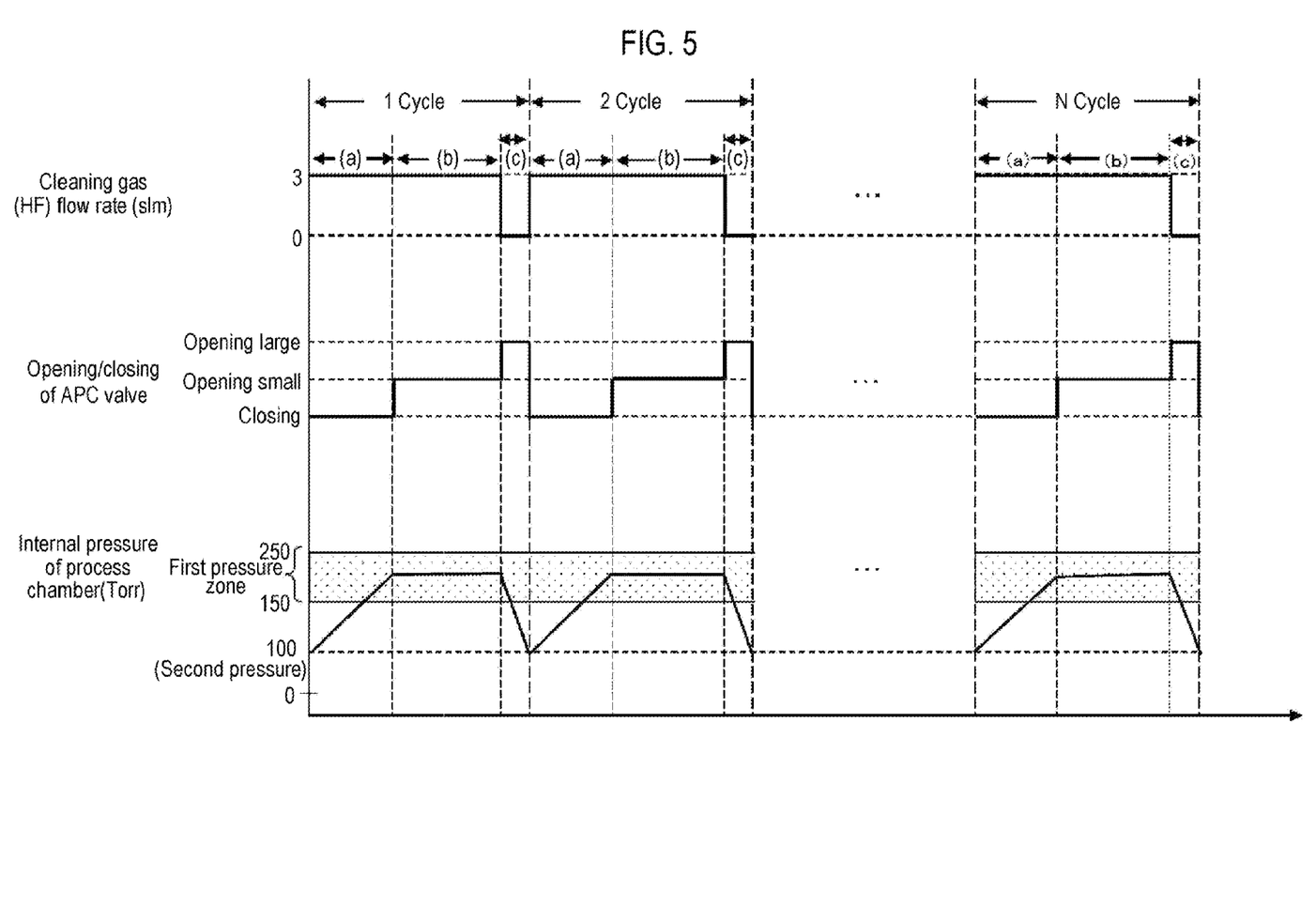
FIG. 5 is a diagram showing a change in the internal pressure of a process chamber in relation to a flow rate of cleaning gas and opening/closing of a valve according to the embodiments of the present disclosure.

In the cleaning process shown in FIG. 5, deposits that adhere to the interior of the process chamber 201 are removed by performing a cycle a predetermined number of times, the cycle including performing sequentially: a cleaning step (a) of supplying a HF gas as a cleaning gas into the process chamber 201 until the internal pressure of the process chamber 201 rises to a first pressure range while exhaust of the interior of the process chamber 201 is stopped; a cleaning step (b) of performing the exhaust of the interior of the process chamber 201 and the supply of the HF gas into the process chamber 201 in parallel so as to maintain the internal pressure of the process chamber 201 within the first pressure range; and an exhausting step (c) of performing exhaust of the interior of the process chamber 201 until the internal pressure of the process chamber 201 reaches a second pressure that is below the first pressure range while the supply of the HF gas into the process chamber 201 is stopped.

Hereinafter, an example of the cleaning process in the present embodiments will be described with reference to FIG. 5. In the following description, the operations of various parts constituting the substrate processing apparatus are controlled by the controller 121.

(Boat-Loading Step)

An empty boat 217, that is, a boat 217 not charged with the wafers 200, is lifted by the boat elevator 115 and is then loaded into the process chamber 201. In this state, the seal cap 219 seals the lower end of the manifold 209 via the O-ring 220b.

(Pressure/Temperature-Adjusting Step)

The interior of the process chamber 201 is vacuum-exhausted by the vacuum pump 246 so as to reach a predetermined pressure, for example, 0 Torr (0 Pa). Further, the interior of the process chamber 201 is heated by the heater 207 so as to reach a predetermined temperature. In addition, the rotation of the boat 217 by the rotation mechanism 267 is started. The heating of the interior of the process chamber 201 by the heater 207 and the rotation of the boat 217 are continuously performed until the cleaning step (c) is completed. However, the boat 217 may not be rotated.

(Cleaning Step (a))

First, the exhaust of the interior of the process chamber 201 is stopped. Then, a HF gas is continuously supplied into the process chamber 201 after the process of forming the SiO film on the wafer 200 (the film-forming process), that is, into the process chamber 201 to which deposits such as a SiO film adhere.

Specifically, first, the APC valve 244 is closed to stop the exhaust of the interior of the process chamber 201. Then, the valve 243e is opened to allow the HF gas to flow into the gas supply pipe 232e. The flow rate of the HF gas is adjusted by the MFC 241e, and the HF gas is supplied into the process chamber 201 via the nozzle 249e and the purge space 201a. In this way, the HF gas is supplied from the nozzle 249e as a gas discharge portion formed in a furnace opening (the vicinity of the seal cap 219, the vicinity of the heat-insulating plates 218, the vicinity of an inlet, etc.) to the vicinity of the furnace opening. At the same time, the valve 243f is opened to allow a $N_2$ gas to flow into the gas supply pipe 232f. The flow rate of the $N_2$ gas is adjusted by the MFC 241f, and the $N_2$ gas is supplied into the process chamber 201 via the gas supply pipe 232e and the nozzle 249e. Further, in order to prevent the HF gas from penetrating into the nozzles 249a and 249b, the valves 243c and 243d are opened to allow a $N_2$ gas to flow into the gas supply pipes 232c and 232d, respectively. The $N_2$ gas is supplied into the process chamber 201 via the gas supply pipes 232a and 232b and the nozzles 249a and 249b, respectively. However, as other embodiments, at the same time, the valves 243a and 243b may be opened to allow the HF gas to flow into the gas supply pipes 232a and 232b and then to be supplied into the process chamber 201 via the nozzles 249a and 249b. In addition to the $N_2$ gas, for example, the various rare gases exemplified in the above-described film-forming process can be used as an inert gas.

The HF gas is supplied until the internal pressure of the process chamber 201 rises to the first pressure range. The pressure range is a pressure range in which a desired practical etching rate can be obtained by the HF gas. Here, the pressure range in which the practical etching rate can be obtained refers to a pressure range in which an etching rate so high as to obtain a sufficient cleaning effect even when a cleaning process is performed within a predetermined time. An example of the first pressure range may include a pressure range of 150 to 400 Torr (19,998.4 to 53,328.8 Pa), specifically 150 to 250 Torr (19,998.4 to 33,330.6 Pa). FIG. 5 shows the pressure range of 150 to 250 Torr as the first pressure range.

At this time, the supply flow rate of the HF gas is, for example, a flow rate within a range of 2 to 5 slm (2,000 to 5,000sccm), specifically 3 slm (3,000 sccm). The temperature of the heater 207 is set such that a member constituting the furnace opening formed in the lower portion of the process chamber 201 has a temperature within a range of 0 to 100 degrees C., specifically room temperature (for example, 20 degrees C.) to 100 degrees C., more specifically 60 to 90 degrees C. As a suitable example, when the temperature of the member constituting the furnace opening is set to 75 degrees C., the temperature of the heater 207 is set to, for example, about 100 degrees C. in consideration of heat loss to the surroundings. The supply time of the HF gas is, for example, 10 to 230 seconds, specifically 100 to 140 seconds.

If the temperature of the member constituting the furnace opening is lower than 0 degrees C. or higher than 100 degrees C., a practical etching rate by the HF gas may not be obtained. Further, since a cooling means is required to keep the temperature of this member below room temperature, the temperature of this member is preferably room temperature or higher. Further, by setting the temperature of this member in the range of 60 to 90 degrees C., the highest etching rate can be obtained.

If the supply time of the HF gas is shorter than 10 seconds, it is difficult to raise the internal pressure of the process chamber 201 to the first pressure range, which may make it difficult to etch the deposits at a practical etching rate. This can be solved by setting the supply time of the HF gas to 10 seconds or longer. By setting the supply time of the HF gas to 100 seconds or longer, the internal pressure of the process chamber 201 can be more reliably raised to the first pressure range.

If the supply time of the HF gas exceeds 230 seconds, particles are likely to be generated in the process chamber 201. By setting the supply time of the HF gas to 230 seconds or shorter, the generation of particles can be suppressed. By setting the supply time of the HF gas to 140 seconds or shorter, the generation of particles can be suppressed more reliably.

When the HF gas supplied into the process chamber 201 passes through the process chamber 201, it comes into contact with the surfaces of the members in the process chamber 201, for example, the inner wall of the reaction tube 203, the outer surfaces of the nozzles 249a and 249b, the surface of the cover 209a, the surface of the boat 217, the inner wall of the manifold 209, the upper surface of the seal cap 219, and the like. At this time, the deposits such as a SiO film adhered to the members in the process chamber 201 are removed by thermochemical reaction. That is, the deposits are removed by etching reaction between the HF gas and the deposits.

In this way, in this step, since the HF gas is supplied in a state where the exhaust of the interior of the process chamber 201 is stopped, that is, in a sealed state, the HF gas can be diffused in every corner of the process chamber 201. As a result, the deposits can be uniformly etched regardless of the position in the process chamber 201. Further, since the HF gas is supplied in the sealed state, a higher etching rate can be obtained than a case where the supply of the HF gas and the exhaust of the interior of the process chamber 201 are performed simultaneously.

Further, the HF gas can etch the deposits such as a SiO film in a relatively low temperature zone, as compared with other cleaning gases such as a $F_2$ gas. Therefore, by supplying the HF gas into the process chamber 201 under the above-mentioned conditions, the deposits adhered to the seal cap 219, the heat-insulating plate 218, etc. arranged in regions that are difficult to be heated by the heater 207, for example, in the vicinity of the furnace opening, can be etched efficiently.

Further, the HF gas does not show etching properties for a member formed of SiC. As a result, for example, even if the boat 217 is formed of SiC, it is possible to remove the deposits adhered to the surface of the boat 217 without damaging the boat 217.

When the internal pressure of the process chamber 201 rises to the first pressure range, this step ends.

(Cleaning Step (b))

When the cleaning step (a) ends, a cleaning step (b) is started. In the cleaning step (b), the exhaust of the interior of the process chamber 201 is started while the supply of the HF gas into the process chamber 201 is continued. Specifically, while continuing to supply the HF gas, the APC valve 244 is opened to perform the vacuum-exhaust of the interior of the process chamber 201 while the vacuum pump 246 is actuated. That is, the exhaust of the interior of the process chamber 201 and the supply of the cleaning gas into the process chamber 201 are performed in parallel. Further, when the cleaning step (a) ends, the cleaning step (b) may be continuously executed without performing other steps.

As described above, when the cleaning step (a) is performed, the deposits such as a SiO film adhered to the interior of the process chamber 201 are removed. Further, when the cleaning step (a) is performed, Si contained in the deposits and F contained in the HF gas are combined to generate a silicon tetrafluoride ($SiF_4$) gas or the like in the process chamber 201. As described above, since the cleaning step (a) is performed in the sealed state, the SiO film or the like peeled off by etching and the generated $SiF_4$ gas cannot be discharged to the outside of the process chamber 201. As a result, this SiO film and fluoride derived from the $SiF_4$ gas may float in the process chamber 201 as particles and adhere to the interior of the process chamber 201 again. By exhausting the interior of the process chamber 201 in the cleaning step (b), the SiO film, the fluoride, etc. can be removed (exhausted) from the interior of the process chamber 201 to avoid adhering to the interior of the process chamber 201 again.

Further, in the cleaning step (b), the internal pressure of the process chamber 201 is maintained within the first pressure range. Specifically, when the vacuum exhaust of the interior of the process chamber 201 is performed, the valve opening degree of the APC valve 244 is adjusted so as to maintain the internal pressure of the process chamber 201 within the first pressure range while the vacuum pump 246 is actuated, based on the pressure information detected by the pressure sensor 245.

If the exhaust of the interior of the process chamber 201 is performed without adjusting the valve opening degree of the APC valve 244 in the cleaning step (b), the internal pressure of the process chamber 201 may deviate (decrease) from the first pressure range. As described above, since the first pressure range is a pressure range in which a high etching rate can be obtained, if the internal pressure of the process chamber 201 decreases from the first pressure range, the interior of the process chamber 201 will not be able to be efficiently cleaned. In the cleaning step (b), the internal pressure of the process chamber 201 is maintained within the first pressure range in order to realize efficient etching of the deposits adhered to the interior of the process chamber 201. By maintaining the internal pressure of the process chamber 201 within the first pressure range in this way, both the discharge of the peeled SiO film and the etching of the deposits can be achieved.

In the cleaning step (b), the supply time of the HF gas is set to, for example, 10 to 230 seconds, specifically 100 to 140 seconds. If the supply time of the HF gas is shorter than 10 seconds, the deposits in the process chamber 201 may not be sufficiently etched. This can be solved by setting the supply time of the HF gas to 10 seconds or longer. By setting the supply time of the HF gas to 100 seconds or longer, the deposits in the process chamber 201 can be etched more reliably. Further, in the cleaning step (b), since the HF gas is less likely to diffuse in the process chamber 201 than in the cleaning step (a), if the supply time of the HF gas exceeds 230 seconds, the etching becomes non-uniform, which may make it difficult to etch the deposits in the process chamber 201 uniformly. Non-uniform etching can be suppressed by setting the supply time of the HF gas to 230 seconds or shorter. Non-uniform etching can be further suppressed by setting the supply time of the HF gas to 140 seconds or shorter.

The supply flow rate of the HF gas and the set temperature of the heater 207 are the same as the process conditions in the cleaning step (a).

After a predetermined time passes after the start of the cleaning step (b), this step ends.

(Exhausting Step (c))

When the cleaning step (b) ends, an exhausting step (c) is started. In the exhausting step (c), the supply of the HF gas is stopped while the exhaust of the interior of the process chamber 201 is continued. The supply of the HF gas is stopped in the reverse procedure of the cleaning step (a).

By stopping the supply of the HF gas and continuing the exhaust in this way, the residues of the gas such as the $SiF_4$ gas and the particles generated in the cleaning steps (a) and (b) can be discharged to the outside of the process chamber 201. Further, in continuing the exhaust, the valve opening degree of the APC valve 244 is set to maximum. By doing so, the time required for the exhausting step (c) can be shortened.

Further, by stopping the supply of the HF gas and continuing the exhaust, the internal pressure of the process chamber 201 can be reduced. In the exhausting step (c), the exhaust of the interior of the process chamber 201 is performed until the internal pressure of the process chamber 201 reaches a second pressure that is below the first pressure range.

As described above, in the cleaning step (b), the internal pressure of the process chamber 201 is maintained within the first pressure range. When the cleaning step (a) of the next cycle is started while a high pressure state like the first pressure range is maintained in this way, the HF gas is difficult to diffuse into the process chamber 201, which may cause etching non-uniformity. That is, one of the effects by the cleaning step (a) of diffusing the HF gas into the process chamber 201 cannot be obtained. This may result in impossibility of uniform etching of the deposits in the process chamber 201. In the exhausting step (c), by lowering the internal pressure of the process chamber 201 from the first pressure range to the second pressure and causing a pressure variation to raise the internal pressure to the first pressure range again in the cleaning step (a) of the next cycle, the HF gas can be diffused in the process chamber 201. As a result, it is possible to etch the deposits uniformly.

In particular, in order to evenly supply the HF gas to a member of a region having a complicated structure, such as the furnace opening, it is effective to lower the internal pressure of the process chamber 201 once in the exhausting step (c) to cause the above-mentioned pressure variation.

The second pressure is a lower limit pressure value at which a substantial etching reaction occurs due to the HF gas. Here, the lower limit pressure value at which a substantial etching reaction occurs is the lower limit value of a pressure that can actually cause an etching reaction at a significant etching rate, although it cannot always cause an efficient etching reaction. An example of the second pressure may include a pressure in a range of 100 Torr (13,332.2 Pa) or higher and lower than 150 Torr (19,998.3 Pa). FIG. 5 shows 100 Torr as the second pressure.

The time for exhaust of the interior of the process chamber 201 is, for example, a time within a range of 5 to 15 seconds. As described above, in the exhausting step (c), since the valve opening degree of the APC valve 244 is set to maximum, the internal pressure of the process chamber 201 can be reduced in a short time.

The set temperature of the heater 207 is the same as the process conditions in the cleaning step (a).

Further, in the exhausting step (c), for example, the internal pressure of the process chamber 201 is not lowered to the lower limit (ideally 0 Torr) of a pressure that can be lowered by the exhaust capacity of the vacuum pump 246 for a gas in the process chamber 201, but can only be lowered to the second pressure (for example, 100 Torr (13,332.2 Pa)). This can enable the time until the internal pressure of the process chamber 201 rises to the first pressure range to be shortened in the cleaning step (a) of the next cycle. Since the supply time of the HF gas in the sealed state can be shortened in this way, particles can be suppressed from being generated in the process chamber 201 in the cleaning step (a) of the next cycle. Further, the supply amount of HF gas in the cleaning step (a) of the next cycle can be suppressed.

Further, as described above, in the exhausting step (c), since the internal pressure of the process chamber 201 is lowered only to the second pressure, the HF gas remains without being completely discharged from the process chamber 201. By leaving the HF gas, the deposits in the process chamber 201 can be also etched in the exhausting step (c).

When the internal pressure of the process chamber 201 reaches the second pressure, the exhausting step (c) ends. An example in which the valve opening degree of the APC valve 244 is set to maximum during the exhausting step (c) has been described in the above-described embodiments. However, in order to stabilize the internal pressure of the process chamber 201 to the second pressure before the cleaning step (a) of the next cycle is started, after setting the valve opening degree of the APC valve 244 to maximum, the valve opening degree of the APC valve 244 may be gradually reduced to stop the exhaust of the interior of the process chamber 201 (that is, close the APC valve 244) with the end of the exhausting step (c).

(Performing Predetermined Number of Times)

The interior of the process chamber 201 can be cleaned by performing a cycle a predetermined number of times (N times, where N is a natural number), the cycle including in this order non-simultaneously, that is, without synchronization, performing the above-described cleaning step (a), cleaning step (b), and exhausting step (c). The above cycle may be performed twice or more.

As described above, in the cleaning step (a), the HF gas is supplied into the process chamber 201 until the internal pressure of the process chamber 201 rises to the first pressure range (see FIG. 5). However, in the cleaning step (a) in a cycle (not shown, hereinafter referred to as a "$0^{th}$ cycle") before the cleaning step (a) of the first cycle is started, the supply of the HF gas may be stopped before the internal pressure of the process chamber 201 rises to the first pressure range. This is because the cleaning step (a) after the first cycle is started from the internal pressure of the process chamber 201 of the second pressure (for example, 100 Torr (13,332.2 Pa)), whereas the cleaning step (a) in the $0^{th}$ cycle is started from the internal pressure of the process chamber 201 of 0 Torr (0 Pa). That is, in the cleaning step (a) in the $0^{th}$ cycle, it takes longer for the internal pressure of the process chamber 201 to rise to the first pressure range than the cleaning step (a) after the first cycle. Therefore, in the cleaning step (a) of the $0^{th}$ cycle, the HF gas is supplied for a long time, which is likely to generate particles in the process chamber 201. In order to avoid this, in the present embodiments, the cleaning step (a) in the $0^{th}$ cycle is controlled to stop the supply of the HF gas when a predetermined time passes after the start of the cleaning step (a) in the $0^{th}$ cycle, even before the internal pressure of the process chamber 201 rises to the first pressure range. Further, after the end of the cleaning step (a) in the $0^{th}$ cycle, the internal pressure of the process chamber 201 is set to the second pressure by sandwiching another step, and then the cleaning step (a) in the first cycle is started.

Figure 6A:
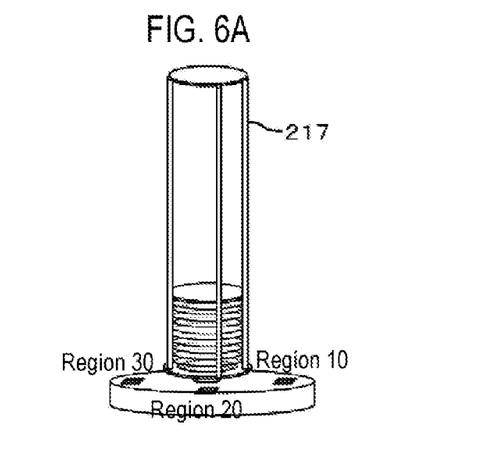
FIG. 6A is a diagram showing arbitrary three regions (regions 10, 20, and 30) in the vicinity of a furnace opening where the removal amount of deposits in a process chamber 201 is measured.

Hereinafter, the superiority of the cleaning method according to the present embodiments in removing the deposits such as a SiO film will be described with reference to FIGS. 6A, 6B, and 7.

The present discloser arranged a chip having a SiO film formed on the surface of the chip in each of three arbitrary regions (regions 10, 20, and 30) in the vicinity of the furnace opening in the process chamber 201 and measured the removal amount (removed thickness) of SiO film on each chip etched by three different cleaning methods (Samples A, B, and C). Then, the removal amount of SiO film on each of these chips was evaluated as the removal amount of deposits when the deposits such as the SiO film were removed by each cleaning method. FIG. 6A is a diagram showing the regions 10, 20, and 30 in the process chamber 201. FIG. 6B is a diagram showing the amount (removed thickness) of SiO films on these chips in the regions 10 to 30, removed by Samples A, B, and C which are three different cleaning methods. The horizontal axis in FIG. 6B represents the regions cleaned by Samples A to C, showing the region 10 on the left side, the region 20 in the middle, and the region 30 on the right side. The vertical axis in FIG. 6B represents the removal amount (etching amount) of SiO film formed on each chip.

Sample A is a cleaning method in which a process of continuously performing a step of supplying a HF gas in a sealed state until the internal pressure of the process chamber 201 rises to 100 Torr (13,332.2 Pa), a step of maintaining the internal pressure of the process chamber 201 at 100 Torr by performing the supply of the HF gas and the exhaust of the interior of the process chamber 201 in parallel, and a step of performing exhaust until the internal pressure of the process chamber 201 reaches 0 Torr in a state where the supply of the HF gas is stopped is performed repeatedly. Sample B is a cleaning method in which a process of continuously performing a step of supplying a HF gas in a sealed state until the internal pressure of the process chamber 201 rises to 200 Torr (26,664.4 Pa), and a step of performing exhaust until the internal pressure of the process chamber 201 reaches 0 Torr in a state where the supply of the HF gas is stopped is performed repeatedly. Sample C is a cleaning method according to the present embodiments described above.

Figure 6B:
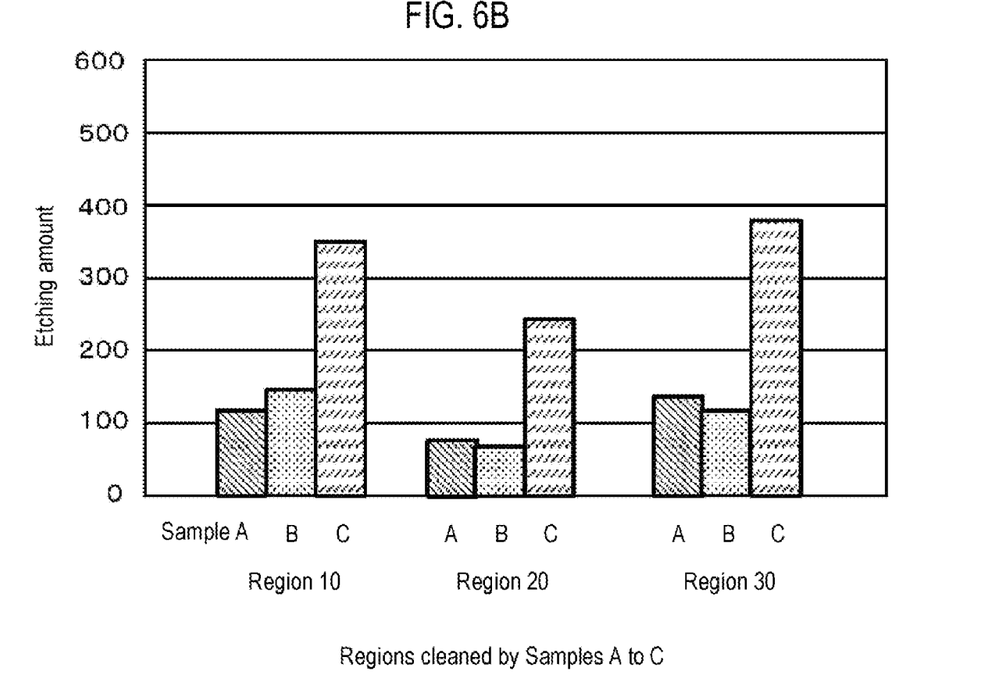
FIG. 6B is a diagram showing the amount of deposits in the regions 10 to 30, removed by three different cleaning methods (Samples A, B, and C).

As shown in FIG. 6B, the removal amount of deposits, which is indicated by the removal amount of SiO film on the chip, is remarkably larger in Sample C than in Samples A and B in the regions 10 to 30. That is, when the interior of the process chamber 201 is cleaned by the method according to the present embodiments, it can be seen that the deposits can be removed regardless of the position in the process chamber 201 and remarkably more deposits can be removed than in Samples A and B.

With the cleaning method according to the present embodiments, the reason for removal of the deposits regardless of the position in the process chamber 201 is that the HF gas is supplied in the sealed state from the second pressure reduced relative to the first pressure range in the cleaning step (a). That is, the HF gas can be diffused into every corner of the process chamber 201, and as a result, the deposits can be uniformly etched regardless of the position in the process chamber 201.

Further, when the interior of the process chamber 201 is cleaned by the method according to the present embodiments, the first reason why remarkably more deposits can be removed than in Samples A and B can be mentioned that the exhaust of the interior of the process chamber 201 and the supply of the HF gas are performed in parallel in the cleaning step (b). As a result, the SiO film and the like peeled off in the cleaning step (a) can be discharged from the process chamber 201, and the deposits can be newly etched while avoiding adhering to the interior of the process chamber 201. In contrast, in Sample B, since a step corresponding to the cleaning step (b) is not performed, it is presumed that the time for performing the etching reaction is short and the removal amount of deposits is small. Further, the second reason can be mentioned that the internal pressure of the process chamber 201 is maintained within the first pressure range (for example, 200 Torr (26,664.4 Pa)) which is a pressure range in which an efficient etching reaction can be obtained in the cleaning step (b). In contrast, in Sample A, since the internal pressure of the process chamber 201 is maintained at a pressure (for example, 100 Torr (13,332.2 Pa)) lower than the first pressure range and the exhaust of the interior of the process chamber 201 and the supply of the HF gas are performed in parallel, it is presumed that more deposits cannot be etched in Sample A than in the cleaning method according to the present embodiments.

Figure 7:
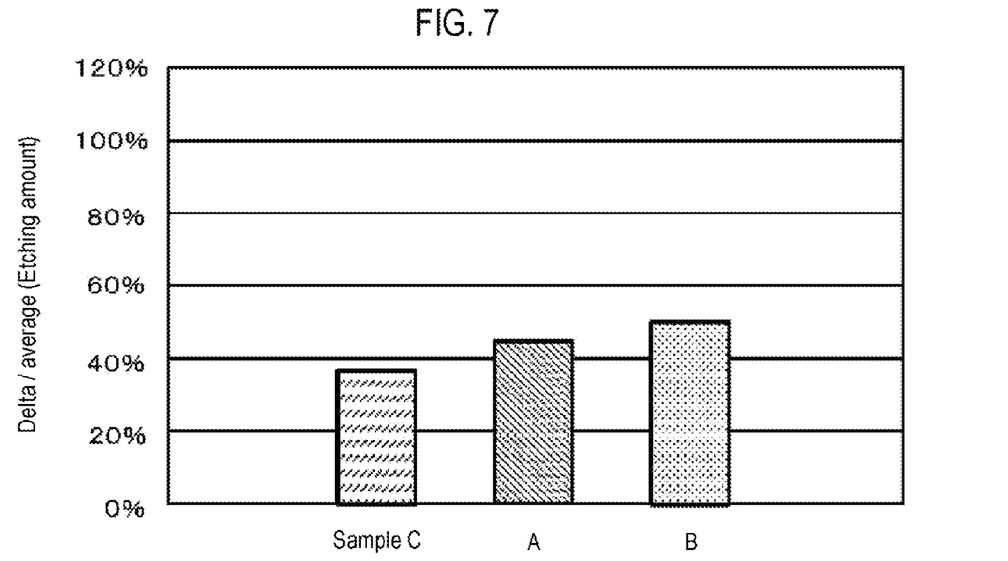
FIG. 7 is a diagram showing a superiority when the interior of the process chamber 201 is cleaned with a method according to the present embodiments.

FIG. 7 is a diagram showing that when the interior of the process chamber 201 is cleaned with the method according to the present embodiments, the uniform removal amount of deposits regardless of the position in the process chamber 201 is indicated by numerical values, in comparison with Samples A and B. On the horizontal axis in FIG. 7, Sample C is shown on the left side, Sample A is shown in the middle, and Sample B is shown on the right side. The vertical axis in FIG. 7 represents the height of position dependence of etching. The height of position dependence is expressed as a percentage for each of Samples A to C by the formula of (delta/average value of etching amounts of regions 10 to 30)×100. The deltas of Samples A to C are values obtained by subtracting the minimum value of the removal amount of SiO film on the chip in the regions 10 to 30 from the maximum value thereof in each of Samples A to C.

As shown in FIG. 7, the position dependence when the interior of the process chamber 201 is cleaned with the method according to the present embodiments (Sample C) is less than 40%, which is the smallest value, the position dependence of Sample A exceeds 40%, which is a smaller value, and the position dependence of Sample B is about 50%, which is the largest value.

(4) Effects of the Present Embodiments

According to the present embodiments, one or more effects set forth below may be achieved.

(a) In the present embodiments, in the cleaning step (a), since the HF gas is supplied in a state where the exhaust of the interior of the process chamber 201 is stopped, that is, in a sealed state, the HF gas can be diffused to every corner in the process chamber 201. As a result, the deposits can be uniformly etched regardless of the position in the process chamber 201. Further, since the HF gas is supplied in the sealed state, a higher etching rate can be obtained than a case where the supply of the HF gas and the exhaust of the interior of the process chamber 201 are simultaneously performed.

Further, in the present embodiments, by performing the exhaust of the interior of the process chamber 201 in the cleaning step (b), the SiO film peeled off, the fluoride produced, and the like in the cleaning step (a) are discharged from the interior of the process chamber 201, thereby avoiding them from adhering to the interior of the process chamber 201 again. Further, in the cleaning step (b), by maintaining the internal pressure of the process chamber 201 within the first pressure range, the deposits adhered to the interior of the process chamber 201 can be etched at a high etching rate. That is, both the discharge of the peeled SiO film and the produced fluoride and the etching of the deposits can be achieved.

In the present embodiments, since the supply of the HF gas is stopped and the exhaust is continued in the cleaning step (c), the residue of particles generated in the cleaning steps (a) and (b) can be discharged to the outside of the process chamber 201. As a result, it is possible to avoid the peeled SiO film and the produced fluoride in the cleaning steps (a) and (b) from adhering again.

Further, the HF gas can be diffused by lowering the internal pressure of the process chamber 201 from the first pressure range to the second pressure in the cleaning step (c) and producing the pressure variation to rise again to the first pressure range in the cleaning step (a) of the next cycle. As a result, it is possible to etch the deposits uniformly and efficiently.

Further, in the cleaning step (c), for example, the internal pressure of the process chamber 201 is not lowered to 0 orr, but only to the second pressure (for example, 100 Torr (13,332.2 Pa)). As a result, in the cleaning step (a) of the next cycle, the time until the internal pressure of the process chamber 201 rises to the first pressure range can be shortened. In this way, since the supply time of the HF gas in the sealed state can be shortened, it is possible to suppress the generation of particles in the process chamber 201 in the cleaning step (a) of the next cycle. In addition, the supply amount of HF gas in the cleaning step (a) of the next cycle can be suppressed.

(b) In the present embodiments, since a cycle including sequentially performing the cleaning step (a), the cleaning step (b), and the exhausting step (c) is performed twice or more, the pressure variation in the process chamber 201 can be reliably produced, thereby cleaning the interior of the process chamber 201 more efficiently.

(c) In the present embodiments, the HF gas containing hydrogen fluoride is supplied as the cleaning gas. The HF gas can etch the deposits such as a SiO film in a relatively low temperature zone as compared with other cleaning gases such as a $F_2$ gas. Therefore, it is possible to efficiently etch the deposits adhered to the seal cap 219, the heat-insulating plates 218, and the like arranged in regions that are difficult to be heated by the heater 207, that is, in the vicinity of the furnace opening.

Other Embodiments

While one or more embodiments of the present disclosure have been described in detail above, the present disclosure is not limited to the above embodiments but may be modified in different ways without departing from the gist of the present disclosure.

Although the HF gas has been described as an example of the cleaning gas, the present disclosure is not limited thereto. For example, it is also possible to supply a mixture of $F_2$ gas and nitric oxide (NO) gas. In this case, the temperature of the heater 207 may be set so that the member constituting the furnace opening formed in the lower portion of the process chamber 201 has a temperature within a range of 300 to 500 degrees C.

Further, in the above embodiments, the manifold 209 installed with the cover 209a on the inner circumference has been described as an example, but the present disclosure is not limited thereto. For example, the present disclosure may be also applied to the manifold 209 not installed with the cover 209a on the inner circumference.

Further, in the above embodiments, the SiO film which is an oxide has been described as an example of the deposits in the process chamber 201, but the present disclosure is not limited thereto. For example, the present disclosure may be also applied to a case where the deposits are a SiN film or a SiON film which is a nitride.

Further, in the above embodiments, as an example that a cycle including sequentially performing the cleaning step (a), the cleaning step (b), and the exhausting step (c) is performed a predetermined number of times, a case that the above cycle is performed twice or more has been described, but the present disclosure is not limited thereto. That is, the predetermined number of times may be once, and the present disclosure may be also applied even when the above cycle is performed only once.

According to the present disclosure in some embodiments, it is possible to improve the cleaning efficiency of the interior of a process chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method comprising:
removing a deposit that adheres to an interior of a process chamber by performing a cycle a predetermined number of times, the cycle including performing sequentially:
(a) supplying a cleaning gas to the interior of the process chamber until an internal pressure of the process chamber rises to a first pressure range, in a state where exhaust of the interior of the process chamber is stopped;
(b) exhausting the interior of the process chamber and supplying the cleaning gas to the interior of the process chamber in parallel to maintain the internal pressure of the process chamber within the first pressure range; and
(c) exhausting the interior of the process chamber until the internal pressure of the process chamber reaches a second pressure that is below the first pressure range, in a state where supply of the cleaning gas to the interior of the process chamber is stopped.

2. The cleaning method of claim 1, wherein the first pressure range is a pressure range in which a desired etching rate is obtained by the cleaning gas.

3. The cleaning method of claim 2, wherein the second pressure is a lower limit pressure value at which an etching reaction occurs due to the cleaning gas.

4. The cleaning method of claim 1, wherein the second pressure is a lower limit pressure value at which an etching reaction occurs due to the cleaning gas.

5. The cleaning method of claim 1, wherein the cleaning gas is a gas including hydrogen fluoride.

6. The cleaning method of claim 5, wherein the first pressure range is 150 Torr or higher and 400 Torr or lower.

7. The cleaning method of claim 6, wherein the second pressure is 100 Torr or higher.

8. The cleaning method of claim 5, wherein the second pressure is 100 Torr or higher.

9. The cleaning method of claim 5, wherein in (a) to (c), a member constituting a furnace opening formed at a lower portion in the process chamber is heated to have a temperature of 0 degree C. or higher and 100 degrees C. or lower.

10. The cleaning method of claim 9, wherein the cleaning gas is supplied to a vicinity of the furnace opening from a gas discharge portion installed at the furnace opening.

11. The cleaning method of claim 5, wherein the deposit is a silicon-containing material.

12. The cleaning method of claim 11, wherein the silicon-containing material includes silicon oxide.

13. The cleaning method of claim 1, wherein the cycle is performed twice or more.

14. The cleaning method of claim 13, wherein in at least a second cycle, (a) is started in a state where the internal pressure of the process chamber is maintained at the second pressure.

15. The cleaning method of claim 1, wherein (b) is executed continuously without performing the other acts after executing (a).

* * * * *